(12) United States Patent
Kobayashi et al.

(10) Patent No.: US 7,190,116 B2
(45) Date of Patent: Mar. 13, 2007

(54) DISPLAY DEVICE WITH A NARROW FRAME

(75) Inventors: Hidekazu Kobayashi, Suwa (JP); Osamu Yokoyama, Suwa (JP); Yojiro Matsueda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/025,948

(22) Filed: Jan. 3, 2005

(65) Prior Publication Data

US 2005/0112408 A1 May 26, 2005

Related U.S. Application Data

(62) Division of application No. 10/341,392, filed on Jan. 14, 2003, now Pat. No. 7,038,377.

(30) Foreign Application Priority Data

Jan. 16, 2002 (JP) .............................. 2002-007337

(51) Int. Cl.
*H05B 33/04* (2006.01)
*H01J 1/62* (2006.01)

(52) U.S. Cl. ...................... 313/512; 313/504; 313/506; 445/25; 257/72; 428/690

(58) Field of Classification Search ................ 313/498, 313/512; 438/46; 257/40; 315/169.3
See application file for complete search history.

(56) References Cited

U.S. PATENT DOCUMENTS

| | | | |
|---|---|---|---|
| 5,882,761 A | 3/1999 | Kawami et al. | |
| 6,284,342 B1 | 9/2001 | Ebisawa et al. | |
| 6,303,963 B1 | 10/2001 | Ohtani et al. | |
| 6,424,326 B2 | 7/2002 | Yamazaki et al. | |
| 6,597,111 B2 * | 7/2003 | Silvernail et al. | 313/506 |
| 6,605,826 B2 * | 8/2003 | Yamazaki et al. | 257/72 |
| 6,623,861 B2 * | 9/2003 | Martin et al. | 428/412 |
| 6,680,577 B1 * | 1/2004 | Inukai et al. | 315/169.3 |
| 6,706,544 B2 | 3/2004 | Yamazaki et al. | |
| 6,836,070 B2 * | 12/2004 | Chung et al. | 313/512 |
| 6,849,877 B2 * | 2/2005 | Yamazaki et al. | 257/86 |
| 6,888,305 B2 * | 5/2005 | Weaver | 313/506 |
| 2003/0137242 A1 | 7/2003 | Seki | |
| 2003/0164497 A1 * | 9/2003 | Carcia et al. | 257/40 |

FOREIGN PATENT DOCUMENTS

JP 10198285 A * 7/1998
JP A 2001-343933 12/2001

* cited by examiner

*Primary Examiner*—Sikha Roy
(74) *Attorney, Agent, or Firm*—Oliff & Berridge, PLC

(57) ABSTRACT

An object of the present invention is to provide a display device capable of narrowing the area of the frame. In order to achieve this object, the display device according to the present invention has a substrate having a plurality of arranged display elements and a wiring layer of a power source on the peripheral side; a bank layer for mutually separating the display elements; an electrode layer for covering the plurality of display elements and the bank layer; and a sealing substrate for further covering the electrode layer by joining the peripheral portion of the substrate and the sealing portion circling around the periphery via a joining element such as an adhesive; wherein the periphery of the sealing substrate is positioned inside the periphery of the substrate, and the peripheral portion of the electrode layer is connected to the wiring of the power source within the sealing portion.

13 Claims, 18 Drawing Sheets

A-B CROSS SECTION

A-B CROSS SECTION

C-D CROSS SECTION

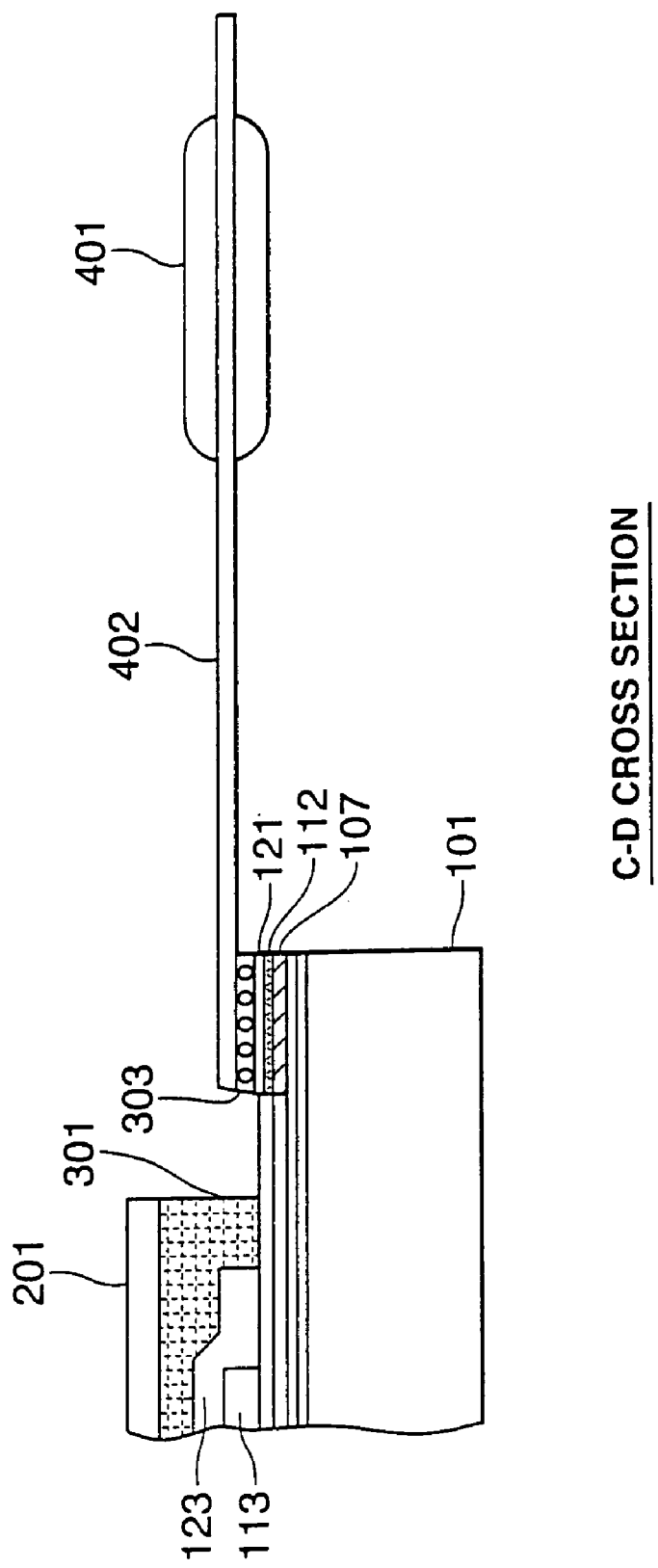

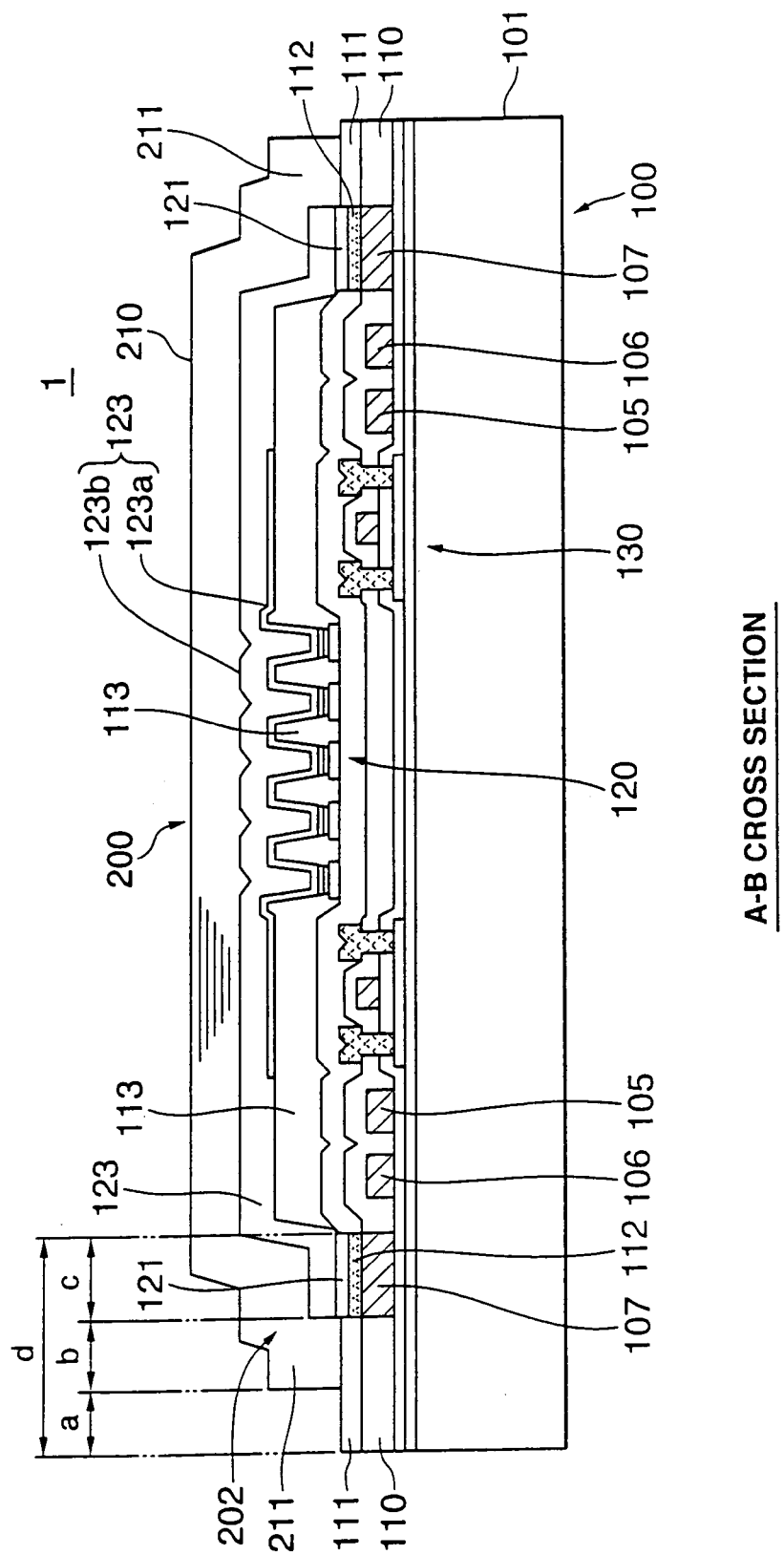

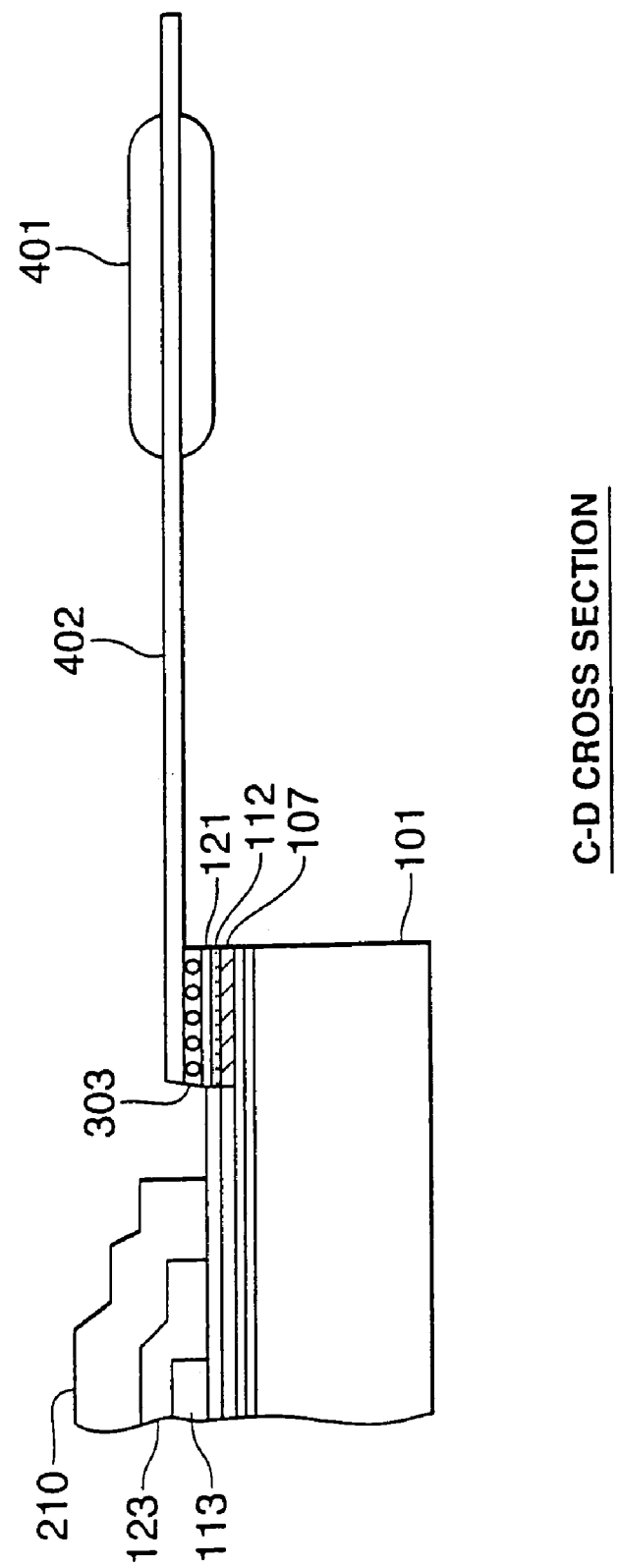

DISPLAY DEVICE WITH A NARROW FRAME

This is a divisional application of U.S. application Ser. No. 10/341,392, filed on Jan. 14, 2003 now U.S. Pat. No. 7,038,377.

BACKGROUND OF THE INVENTION

1. Field of the Invention

The present invention pertains to a flat, panel-type display device, and in particular to an invention of a display device capable of narrowing the so-called frame, which is the non-display area at the periphery of a display unit.

2. Description of the Related Art

There has been provided a display device that forms screens of text, images or video pictures by arranging a plurality of display elements and controlling the status of the respective display elements. An example of this would be an electro-optic device such as a liquid crystal display device or an organic EL display device. With this kind of display device, deterioration of components is prevented by hermetically sealing a substrate and another substrate, or a substrate and a sealing member.

For instance, with an organic EL display device, the peripheral gas infiltrating within the device influences the life duration of the organic EL light emitting element. In particular, moisture (water vapor) and oxygen deteriorate metal electrodes, and complicate the prolonged operation of the light emitting element. Thus, a substrate having formed thereon an array of the organic EL display element is sealed with the likes of a metal can, waterproof plastic package or protective film to acquire gas barrier property against water vapor and oxygen.

Nevertheless, when forming the likes of a sealing metal can or sealing protective film on a display element substrate with display elements formed thereon, space is required for connecting the sealing metal can or sealing protective film to the display element substrate. Moreover, in order to secure the foregoing gas barrier property, a prescribed amount of connection width (connection space) also becomes necessary. Since the sealing of the display element substrate is conducted at the periphery of this substrate, a so-called frame that is not utilized as a display area arises at such periphery. This complicates the miniaturization and unrestricted design of devices such as portable telephone devices and portable information devices mounted with a display device.

Accordingly, an object of the present invention is to provide a display device capable of narrowing the area of the frame.

Moreover, another object of the present invention is to provide a display device in which the gas barrier property does not deteriorate even upon narrowing the area of the frame.

SUMMARY OF THE INVENTION

In order to achieve the foregoing objects, the display device according to the present invention comprises: a substrate having a plurality of display elements separated with a bank layer, and a wiring layer; an electrode layer for covering the plurality of display elements and the bank layer; and a sealing substrate for covering the substrate by joining at least the peripheral sealing area of the substrate; wherein the wiring layer is formed at a part of the sealing area of the substrate; and the peripheral portion of the electrode layer is connected to the wiring layer within the sealing area.

According to the foregoing structure, since a part of the sealing area of the substrate can be utilized as the connection area of the electrode and wiring, the size of the sealing substrate can be reduced while securing the connection width necessary for gas barrier or the like, and the portion that is the structural element of the frame of the display device is thereby reduced in size.

Preferably, the electrode layer is a common electrode (negative electrode or positive electrode) of the respective display elements.

Preferably, the common electrode layer is formed to include at least two types of electrode layers in which one is a lower layer positioned on the display element side and the other is an upper layer positioned thereon; and the upper electrode layer is formed from material having superior gas barrier property or anti-environmental property in comparison to the upper electrode layer. Thereby, deterioration of the lower electrode layer can be suppressed. Moreover, a film with favorable luminous efficiency (or operational efficiency) can be used as the lower electrode layer.

Preferably, the lower electrode layer is formed to cover the plurality of display elements in their entirety and at least a part of the bank layer, but away from the sealing portion of the sealing substrate; and the upper electrode (layer) is formed to cover the lower (part) electrode layer in its entirety and to reach inside the sealing portion of the sealing substrate. Thereby, the lower electrode layer will be away from the joining portion where gas may infiltrate, and it will thereby be possible to suppress the deterioration of the lower electrode layer. Moreover, a film with favorable luminous efficiency can be used as the lower electrode layer.

Preferably, the sealing substrate includes a protrusive sealing portion so as to circle around the periphery of the sealing substrate opposite to the sealing area of the substrate. Thereby, a hollow sealing substrate (having a concave cross section) may be used for sealing the substrate.

Preferably, the top face of the wiring layer of the substrate is formed flatly, and the electrode layer is laminated thereon and connected electrically. Thereby, conduction of the wiring layer and electrode layer can be sought with certainty.

Preferably, the face of the substrate opposite the sealing portion of the sealing substrate is also formed flatly. Thereby, the stress applied to the sealing portion of the substrate can be made uniform.

Preferably, multilayer thin films are used instead of the sealing substrate for sealing. Thereby, a flexible film-like display device can be realized.

Preferably, the size of the sealing area of the substrate is determined with the margin necessary in securing the gas barrier property or anti-environmental property of the joining means, and the connection area of the electrode layer and the wiring layer is included in the margin. Thereby, reliability can be secured and the frame of the display device can be narrowed.

Preferably, the joining means includes an adhesive film, and the film thickness of the adhesive film does not exceed 20 μm. Moreover, the width of the adhesive film is at least 1 mm or more. Thereby, the contact face with outside atmosphere can be reduced, the infiltration length of outside atmosphere can be secured considerably, and the deterioration of the sealed element can be suppressed thereby.

Preferably, the periphery of the sealing substrate is positioned inside the periphery of the substrate in an amount corresponding to the margin upon mounting the sealing substrate on the substrate. Thereby, the sealing substrate can be mounted on the substrate with ease.

Moreover, preferably, the periphery of the sealing substrate is positioned inside the periphery of the substrate in an amount corresponding to at least the scribe margin upon dividing the substrate. Thereby, space necessary for separating and cutting the display after assembly is secured.

Preferably, the sealing substrate is structured from a flat substrate. Thereby, sealing can be performed more easily.

Preferably, the bank layer is not positioned within the sealing area of the substrate. Thereby, since the bank layer will be away from the sealing area, the bank layer may be formed from an organic material having high moisture permeability.

Preferably, the substrate is a polygonal or a square substrate, and the electrode layer and the wiring layer are connected at one side of this substrate. Thereby, since it will no longer be necessary to lay wiring with the electrode layer in the other sides (or three sides), such other sides (or three sides) can be narrowed. This kind of structure is effective in cases as with a display device of a portable telephone wherein the module may be elongated in a certain direction, but is restricted in other directions.

Preferably, the substrate is a polygonal or a square substrate, and the electrode layer and the wiring layer are respectively connected at two sides of this substrate. This kind of structure is effective in cases of installing a plurality of driver ICs in order to reduce wiring resistance up to the electrode and displaying large volumes of data.

Preferably, the substrate is a polygonal or a square substrate, and the electrode layer and the wiring layer are respectively connected at three sides of this substrate. This kind of structure is capable of sufficiently reducing the wiring resistance up to the electrode through connection at such three sides, and seeking the connection with an external circuit with one side.

Preferably, the substrate is a polygonal or a square substrate, and the electrode layer and the wiring layer are respectively connected at four sides of this substrate. This kind of structure is preferable in cases of reducing the wiring resistance as much as possible, which becomes necessary when realizing a large-sized high resolution display device. Here, a pullout wiring may be formed via an insulation film below the power source wiring layer, or the connection area of the electrode layer and power source wiring layer may be divided into a plurality of blocks, and the pullout wiring may be disposed collectively between the mutual blocks.

Preferably, dummy display elements are disposed around the periphery of the area where the plurality of display elements is arranged. Thereby, substantial influence on the display elements is alleviated. Moreover, application (amount of application) of the display element material with the inkjet system can be made uniform.

Preferably, the display element is an organic EL element. The lower electrode layer is calcium and the upper electrode layer is aluminum.

Preferably, the bank layer is formed from resin material. Color mixture can be prevented since a bank layer exists between the display elements.

Preferably, the display device is employed in electronic devices such as a digital camera, personal computer, flat-panel television, portable information terminal device, portable telephone device, electronic book, and the like. Thereby, various devices with minimal excess non-display areas (frame) at the periphery of the display device are obtained.

The manufacturing method of a display device according to the present invention comprises: a step of forming at least a wiring layer at a part of the sealing area established inside the periphery of the substrate to which an electrical circuit is to be formed; a step of forming an element separation layer comprising a plurality of grooves for mutually separating the plurality of display elements excluding the top (face) of the wiring layer of the substrate; a step of forming the display elements to each of the plurality of grooves of the element separation layer; a step of forming a common electrode layer on the plurality of display elements, the display separation layer, and the wiring layer, respectively; a joining material application step of applying joining material to the sealing area of the substrate; and a sealing step of joining a sealing substrate having a circular sealing portion at the sealing area of the substrate with the joining material and sealing the substrate.

According to the foregoing structure, the frame of the display device can be narrowed.

Preferably, the joining material application step applies the joining material on the connection area of the common electrode layer and the wiring layer formed within the sealing area of the substrate and to the remaining sealing area (other than the foregoing area). Thereby, the sealing area between the substrate and the sealing substrate can be sealed with the required joining material.

Moreover, the manufacturing method of a display device according to the present invention comprises: a step of forming at least a wiring layer at a part of the sealing area established inside the periphery of the substrate to which an electrical circuit is to be formed; a step of forming an element separation layer comprising a plurality of grooves for mutually separating the plurality of display elements excluding the top (face) of the wiring layer of the substrate; a step of forming the display elements to each of the plurality of grooves of the element separation layer; a step of forming a common electrode layer on the plurality of display elements, the display separation layer, and the wiring layer, respectively; a joining material application step of applying joining material to the sealing area of the substrate and the common electrode layer; and a sealing step of joining a sealing substrate covering the sealing area of the substrate and the common electrode layer with the joining material and sealing the substrate.

According to the foregoing structure, the frame of the display device can be narrowed.

Moreover, the manufacturing method of a display device according to the present invention comprises: a step of forming at least a wiring layer at a part of the sealing area established inside the periphery of the substrate to which an electrical circuit is to be formed; a step of forming an element separation layer comprising a plurality of grooves for mutually separating the plurality of display elements excluding the upper (face) of the wiring layer of the substrate; a step of forming the display elements to each of the plurality of grooves of the element separation layer; a step of forming a common electrode layer on the plurality of display elements, the display separation layer, and the wiring layer, respectively; and a sealing step of forming a multilayer film on the substrate for covering the sealing area and the common electrode layer and sealing the substrate.

Preferably, the multilayer film contains a film that prevents the permeation of water or gas.

Preferably, the common electrode layer is formed to include at least two types of electrode layers in which one is a lower layer positioned on the display element side and the other is an upper layer positioned thereon; and the upper electrode layer is formed from material having superior gas barrier property or anti-environmental property in comparison to the lower electrode layer. Thereby, deterioration of the light emitting element can be prevented.

Preferably, the lower electrode layer is formed to cover the plurality of display elements in their entirety and at least a part of the bank layer, but away from the sealing portion of the sealing substrate; and the upper electrode layer is formed to cover the lower electrode layer in its entirety and to reach inside the sealing portion of the sealing substrate. Thereby, deterioration of the lower electrode layer can be prevented.

BRIEF DESCRIPTION OF THE DRAWINGS

FIG. 5(a) and FIG. 5(b) are explanatory diagrams for explaining the flatness in the sealing portion of the substrate periphery, wherein FIG. 5(a) illustrates a case when there is misalignment between the substrate wiring layers 121, 112, 107 and the common electrode 123, and FIG. 5(b) illustrates a case when there is no such misalignment;

FIG. 8 is a cross section along section C-D of FIG. 1 for explaining the second embodiment of the display device according to the present invention;

FIG. 10 is a cross section along section A-B of FIG. 1 for explaining the third embodiment (example of employing a multilayer sealing film) of the display device according to the present invention;

FIG. 11 is a cross section along section C-D of FIG. 1 for explaining the third embodiment of the display device according to the present invention;

DESCRIPTION OF THE PREFERRED EMBODIMENTS

Embodiments of the present invention are now explained with reference to the drawings.

Figure 1:
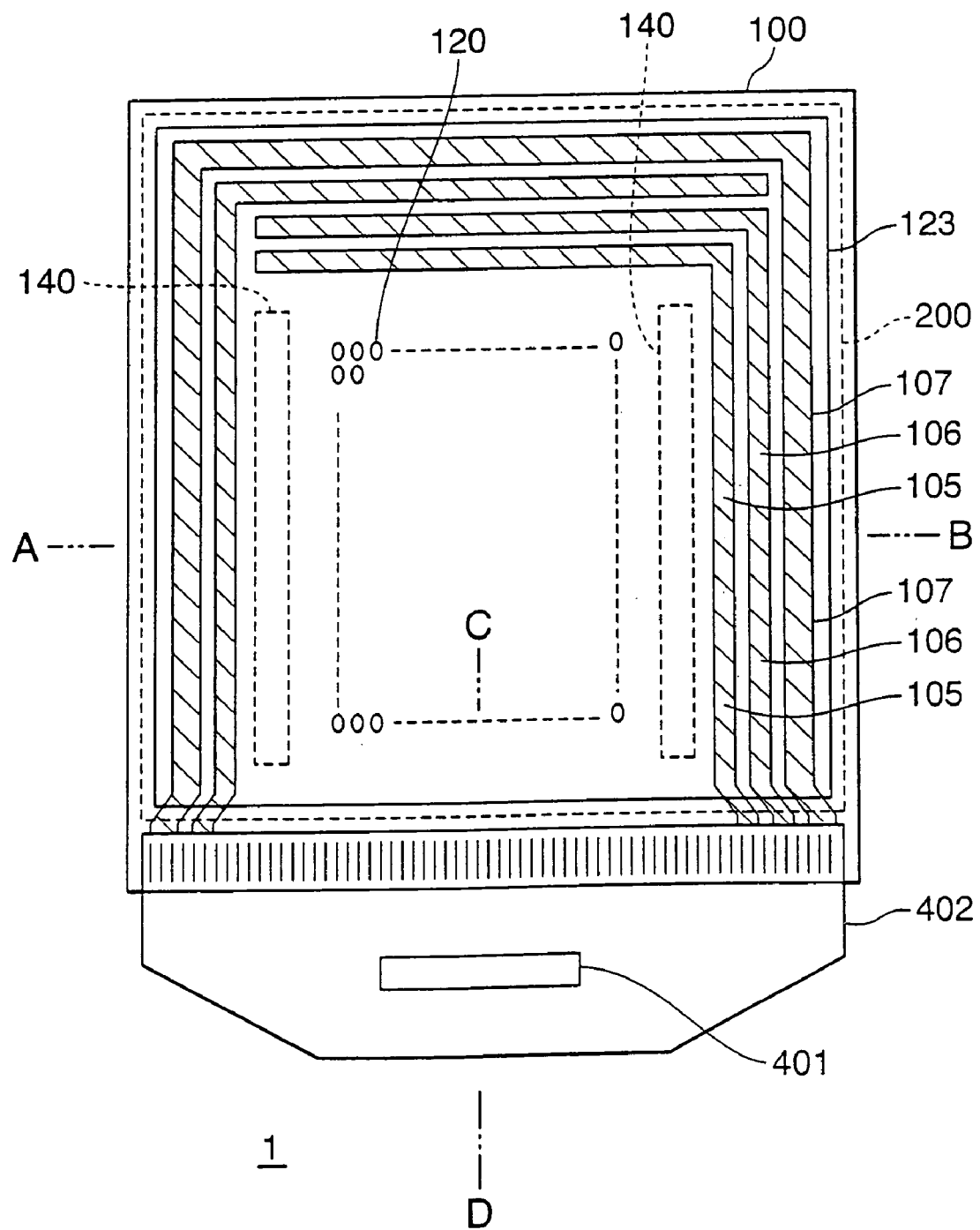
FIG. 1 is a plan view for explaining the first embodiment of the display device according to the present invention.
Figure 2:
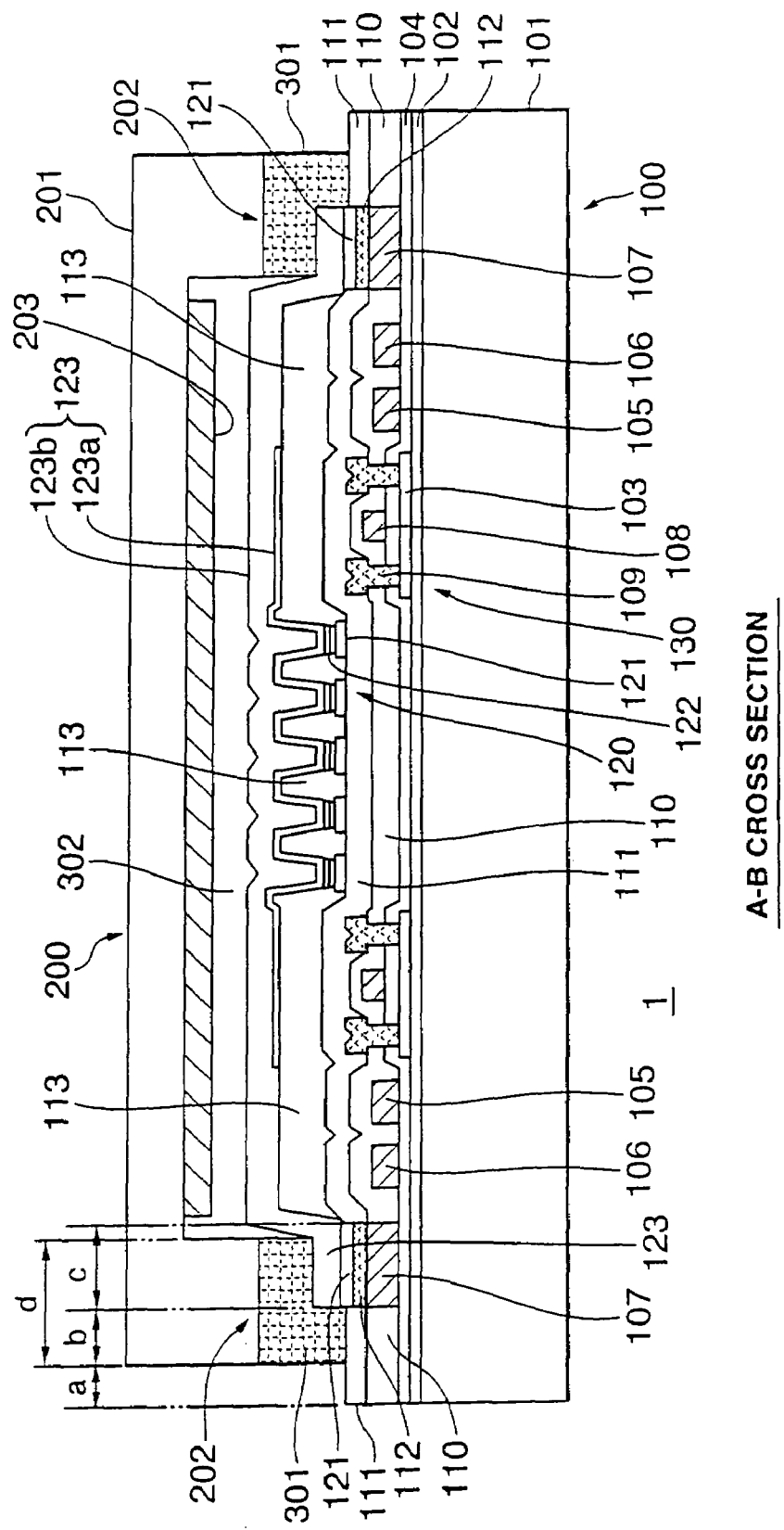
FIG. 2 is a cross section along section A-B of FIG. 1 for explaining the first embodiment (example of employing a sealing substrate) of the display device according to the present invention.
Figure 3:
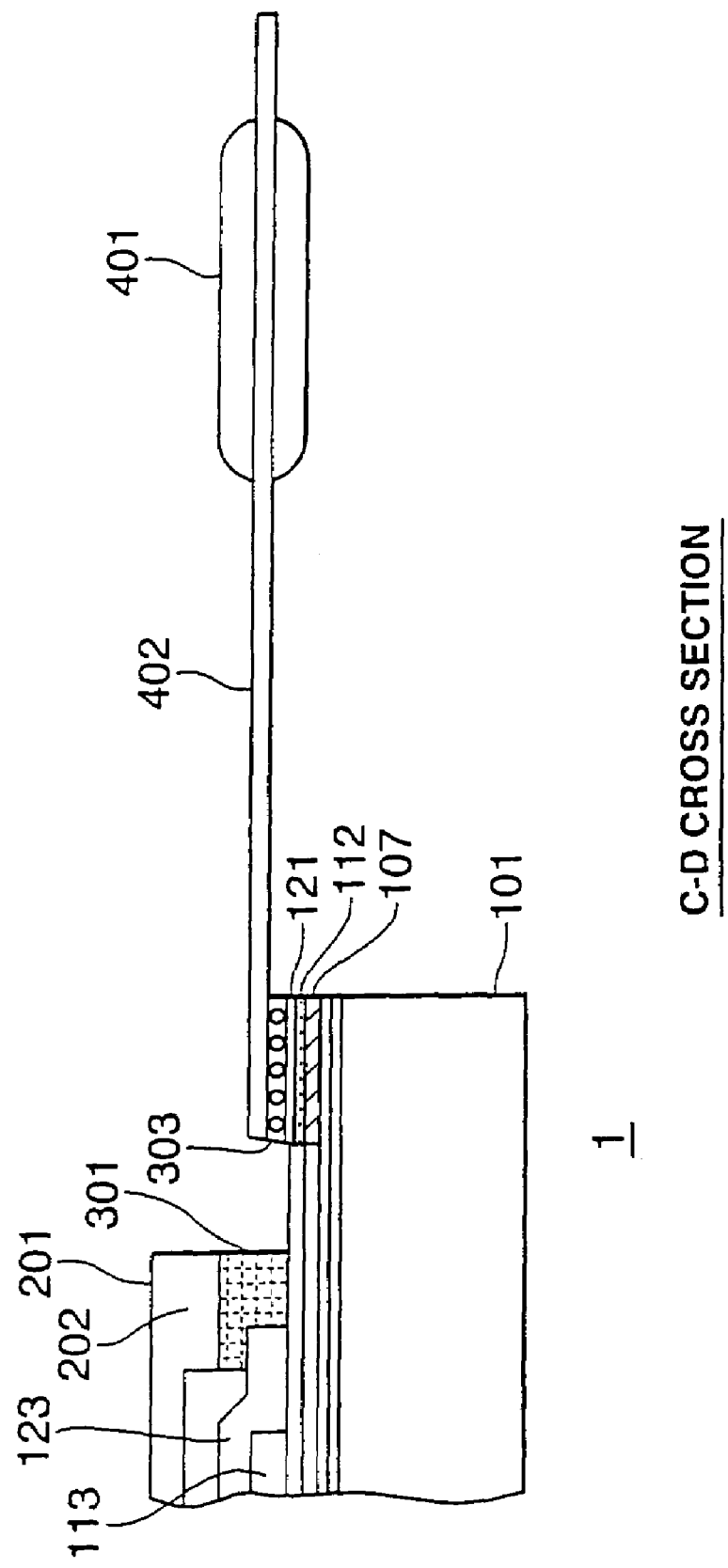
FIG. 3 is a cross section along section C-D of FIG. 1 for explaining the first embodiment of the display device according to the present invention.

FIG. 1 to FIG. 3 are explanatory diagram for explaining the first embodiment of the display device according to the present invention. FIG. 1 is a plan view schematically showing the display device. FIG. 2 is a cross section schematically showing the cross section along direction A-B of FIG. 1. FIG. 3 is a cross section schematically showing the cross section along direction C-D of FIG. 1. The same reference numerals are given to the components corresponding in the respective diagrams. Moreover, the display element area in the center of FIG. 2 is illustrated in a simplified manner.

The display device 1 of the first embodiment shows a case of an organic EL display device. When classified broadly, this display device 1 is structured from a TFT substrate 100 comprising a light emitting element array, a sealing substrate 200 for sealing the light emitting element array, a joining means 301 for joining the TFT substrate 100 and sealing substrate 200, a scan line driving unit 140 for driving the scan line of the TFT substrate 100, a data driver IC 401 for driving the data line of the TFT substrate 100, and so on.

The TFT substrate 100 is structured from a plurality of organic EL light emitting elements 120 arranged in a matrix, a TFT transistor 130 for driving such light emitting elements 120 or which functions as a switch, and so on. With the TFT substrate 100, a protective film 102 is formed on a glass substrate 101, silicon is deposited thereon, low-concentration impurities are injected therein and patterning is performed thereto in order to form a polysilicon TFT area 103. Moreover, the substrate 100 may also be a resin substrate. A gate insulation film 104 formed of oxidized silicon is deposited thereon with the CVD method. Aluminum is deposited thereon with the sputtering method and patterning is performed thereto in order to form organic EL driving power source wiring films 105 and 106, an organic EL negative electrode wiring layer 107, and a gate wiring film 108 of the TFT 130. Next, a mask is used to inject high-concentration ion into the source drain area of the TFT area 103, and oxidized silicon is deposited thereon in order to form a first interlayer insulation film 110. A contact hole mask is used to perform anisotropic etching in order to open a contact hole in the TFT area 103. Next, aluminum is deposited thereon and pattering is performed thereto in order to form a source drain electrode 109 and a connection electrode 112. Next, oxidized silicon is deposited thereon in order to form a second interlayer insulation film 111. In order to suppress the arrival of TFT deterioration factors such as metal ion and water at the TFT, as the second interlayer insulation film, for example, used may be an insulation film containing at least one element among boron, carbon, nitrogen, aluminum, silicon, phosphorus, ytterbium, samarium, erbium, yttrium, gadolinium, dysprosium, neodymium, and so on. A display element group described later is formed thereon.

The center area of the TFT substrate 100 structured as described above is the display area to which the display element group is disposed. The light emitting element 120 of red emission, green emission and blue emission as the display element is arranged in a matrix with these three colors as a single pixel. Each of the emitted lights of the respective light emitting elements 120 is emitted outside via the glass substrate 101. Moreover, light may also be abstracted from the side opposite the TFT substrate 100. Here, it is preferable that the layers above the light emitting layer is structured of material having high optical transmittance. In order to separate the respective light emitting elements and prevent color mixture, a bank layer 113 is formed between the respective light emitting elements and at the periphery of the display area. This bank layer 113 may be formed, for instance, by patterning an organic material film such as a photoresist.

The light emitting element 120 is structured from a transparent (ITO) positive electrode 121, an organic EL layer/electron hole transport layer 122, a negative electrode (common electrode) 123, and so on. The negative electrode 123 has a two-layer structure, and, for example, the lower layer is a calcium film 123a and the upper layer is an aluminum film 123b. The negative electrode 123a is formed across the respective light emitting elements 120, the bank layers mutually between the respective light emitting elements 120, and the bank layer 113 at the periphery of the display area, and, the contact with the upper layer negative electrode 123b is secured thereby. The upper layer negative electrode 123b also functions as a wiring film, and is connected to the wiring film 107 in the area at the lower part of the sealing portion 202. As described above, the luminous efficiency can be improved by making the negative electrode 123a, which is in contact with the organic EL layer/electron hole transport layer 122, a calcium film, and, by covering the calcium film 123a in its entirety with the upper layer aluminum film 123b, low-resistance wiring and gas barrier (erosion prevention) are sought. Moreover, this may also employ an organic EL element structure where an electron injection layer or an electron transport layer is additionally disposed on the light emitting layer (organic EL layer/electron hole transport layer), or a laminate of such electron injection layer and electron transport layer may be additionally disposed thereon.

The top face of the substrate 100 structured as described above is sealed with a sealing substrate 200 having a cross inverted concave shape. This sealing substrate 200 is structured, for instance, from metal, glass, ceramic, plastic or the like, and comprises a tabular sealing plate 201, a protrusive sealing portion 202 formed around the periphery at the bottom face of this sealing plate, and a drying agent (material) 203. The drying agent 203 adsorbs the water vapor or oxygen gas infiltrating inside.

Nitrogen gas as the inert gas is filled between the TFT substrate 100 and the sealing substrate 200, and both substrates 100 and 200 are joined at the sealing portion 202 via an adhesive 301 as the joining means. Although the adhesive may be suitably selected from those having thermosetting properties or ultraviolet curing properties, in particular, those having low permeability against gas such as water vapor are employed.

As shown in FIG. 2, the substrate 100 is provided with a margin a for placing the sealing substrate 200. Moreover, width d of the sealing portion 202 of the sealing substrate 200; that is, sealing area d of the substrate 100, is set to a suitable width (corresponds approximately to width b of the portion of only the adhesive 301 and the connection width c of the vertical wirings) for the adhesive 301 to prevent the infiltration of gas. For instance, this width (width d of the adhesive 301) is made to be 1 mm or more so as to secure a long infiltration length of the outside atmosphere, whereby the infiltration of water vapor and oxygen gas from the adhesive layer will become difficult. Moreover, the film thickness of the adhesive 301 is made to be 20 μm or less so as to reduce the contact face of the adhesive 301 and outside atmosphere, whereby the infiltration of gas will become difficult. This will also suppress the deterioration of elements sealed inside.

The negative electrode film 123b is placed within the area at the lower part of this sealing portion 202 in an amount corresponding to the vertical connection width c, and connected to the wiring 107 of the substrate 100 via the ITO film 121 and the source drain electrode film 112.

As shown in FIG. 3, the data line of the substrate 100 is connected to the electrode 121 of the substrate end, and connected to a wiring tape 402 via an anisotropic conductive film 303. The data driver IC 401 for driving the respective data lines is bonded in the middle of this wiring tape. A part of the negative electrode 123 is also placed into the sealing portion 202 at the lower part of the substrate 100.

Figure 4:
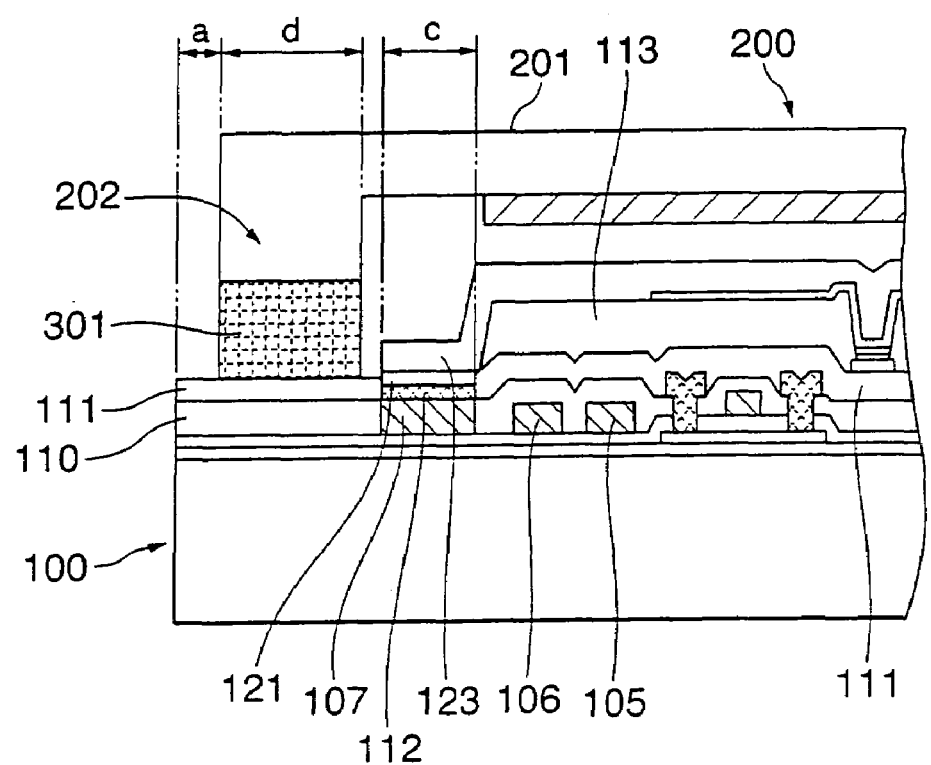
FIG. 4 is an explanatory diagram for explaining the edge structure of a general display device (comparative example) for explaining the effect of the first embodiment.

FIG. 4 shows a general joining example (comparative example) of the TFT substrate 100 and the sealing substrate 200. In FIG. 4, the components corresponding to those illustrated in FIG. 2 are given the same reference numerals, and the explanation of such components is omitted.

In this example, a mounting margin a upon mounting the sealing substrate 200 on the TFT substrate 100 and a margin d of the adhesive 301 for preventing the infiltration of gas and securing reliability of sealing are secured outside the connection area c of the negative electrode 123 and the substrate wiring 107. The distance from the end of the TFT substrate 100 to the connection area c is mounting margin a+margin d of adhesive 301+connection area c. With this structure, the dimension of the non-display area at the periphery of the display device 1 is large.

Contrarily, with the structure of the first embodiment depicted in FIG. 2, the negative electrode 123 or the connection area c of the negative electrode 123 and the wiring 107 is placed into the lower part area (width d) of the sealing portion 202. The distance from the end of the TFT substrate 100 to the connection area is mounting margin a+margin d of adhesive 301. Margin d of the adhesive 301 will be approximately b+c, and the dimension of the non-display area will be reduced in an amount corresponding to the margin c of the wiring connection portion.

Figure 5A:
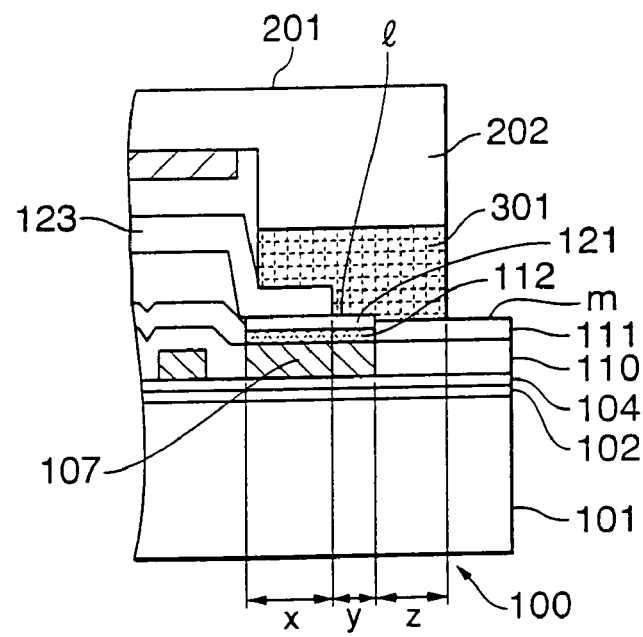
Figure 5B:
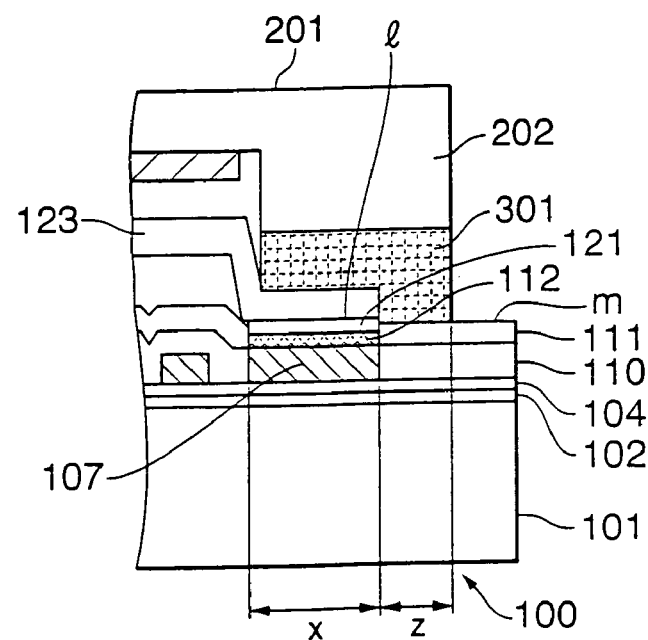

Moreover, with the structure of the first embodiment, the lower part area of the sealing portion 202 is formed, as shown in FIG. 5(a), to be practically flat, or such that the unevenness does not change. In FIG. 5(a) and FIG. 5(b), the components corresponding to those illustrated in FIG. 2 are given the same reference numerals, and the explanation of such components is omitted.

In FIG. 5(a) and FIG. 5(b), x represents the connection width of the power source wiring 107 and the common electrode film 123, y represents the misalignment between the power source wiring 107 and the common electrode film 123, and z represents the sealing margin under the sealing area at the periphery of the foregoing connection area.

As illustrated in these diagrams, the power source wiring 107 of the TFT substrate 100 at the lower part area of the sealing portion 202 is formed to be relatively broad and flat. The power source wiring 107 is, as shown in FIG. 1, disposed at the periphery of the substrate 100 so as not to intersect with other wirings. Thereby, the generation of unevenness arising from the intersecting of wirings is avoided as much as possible, and the power source wiring 107 is formed to be flat. The aluminum film 112 and ITO film 121 are formed flatly thereon and aluminum of the common electrode film 123 is further deposited on the flat face 1 of these conductive films in order to realize electrical connection with the negative electrode of the light emitting element 120. The top face (insulation film 111) m of the substrate 100 at the peripheral side of this connection area is also formed to be flat.

Preferably, as shown in FIG. 5(*a*), the misalignment y between the power source wiring 107 and the common electrode film 123 is made to be 0. Thereby, the width of the power source wiring 107 and the connection width of the common electrode 123 are coincided to minimize wiring resistance, and, as a result, the waste of measurement in the width direction can be avoided.

As described above, the conductive portion (vertical conductive portion) x of the power source wiring film 107 and the common electrode 123 is formed to be flat, and the sealing area z of the periphery thereof is also made to be a flat area. Vertical conduction is carried out with certainty, unevenness of the film end portion after forming the common electrode film 123 is evenly formed, and height of the vertical conductive portion is aligned at the TFT substrate 100 side so as to prevent the sealing conditions from changing in the vertical conductive area portion. Further, by securing a flat portion z at the peripheral portion z of the vertical conductive portion x, the stress applied to the sealing portion from can sealing can be made uniform.

FIG. 6(*a*) to FIG. 6(*d*) are process charts for explaining the manufacturing process of the display device 1 according to the first embodiment.

Foremost, as shown in FIG. 6(*a*), the TFT substrate 100 is formed. In other words, a silicon nitride film is deposited on the glass substrate 101 with the CVD method in order to form the protective film 102. Silicon is deposited thereon with the CVD method. Further, low-concentration impurities are injected therein, and thermal processing of laser annealing is performed thereto in order to form the polysilicon film 103. Pattering is performed to this polysilicon film 103 in order to form the TFT area 130. The gate insulation film 104 formed from oxidized silicon is deposited thereon with the CVD method. Aluminum is deposited thereon with the sputtering method and patterning is performed thereto in order to form organic EL driving power source wiring films 105 and 106, the organic EL negative electrode wiring layer 107, and the gate wiring film 108 of the TFT 130. Next, a mask is used to inject high-concentration ion into the source drain area of the TFT area 103, and the impurities are activated with thermal processing. Further, oxidized silicon is deposited thereon with the CVD method in order to form the first interlayer insulation film 110. A contact hole mask is used to perform anisotropic etching to this interlayer insulation film 110 in order to open a contact hole in the source drain area of the TFT area 103. Next, aluminum is deposited thereon and pattering is performed thereto in order to from the source drain electrode 109 and the connection electrode 112.

Next, as shown in FIG. 6(*b*), oxidized silicon is deposited thereon in order to form the second interlayer insulation film 111. Etching is performed to the interlayer insulation film 111 on the wiring film 107 in order to expose the aluminum film 112. ITO is deposited thereon with the sputtering method, and patterning is performed thereto in order to form the positive electrode 121 of the light emitting element 120. Moreover, the ITO film 121 is also deposited on the aluminum film 112 on the wiring film 107 in order to adjust the film thickness of the connection area and to prevent oxidization of the aluminum surface.

As shown in FIG. 6(*c*), a photosensitive organic resin film is applied with the spin coating method, and pattering is performed thereto in order to form the bank layer 113 in which the positive electrode (ITO) 121 of the light emitting element is exposed at the bottom part of the groove. This bank layer 113 separates the respective light emitting elements. Next, the EL layer 122 is formed on the positive electrode 121 with the inkjet method. The EL layer 122 is structured, for example, from a light emitting layer, electron transport layer, electron injection layer, hole injection layer, hole transport layer, and so on. Calcium 123*a*, for instance, is patterned on these light emitting elements 120 with vacuum deposition, and patterning is further performed thereto by evaporating the aluminum 123*b*. Calcium 123*a* and aluminum 123*b* structure the negative electrode (common electrode) 123 of the light emitting element 120. By making the negative electrode 123 a two-layer structure covered with the lower layer calcium layer 123*a* and the upper layer aluminum layer 123*b*, infiltration of moisture to the calcium film 123*a* is prevented (securement of gas barrier properties). The aluminum film 123*b* is spread out to the periphery of the substrate 101 as the common electrode 123, and is connected to the wiring film 107 via the ITO film 121 and the aluminum film 112 at the margin c of the wiring connection portion (c.f. FIG. 2).

Next, as shown in FIG. 6(*d*), an adhesive or sealant 301 is applied to the portion including the wiring film 107 at the periphery of the TFT substrate 100, and the sealing substrate 200 having an inverted concave shape with protrusions 202 at the periphery thereof is bonded under an inert gas atmosphere such as nitrogen gas. A drying agent is disposed inside the sealing substrate 200, and adsorbs the moisture or oxygen infiltrating inside. As the adhesive, preferably used is an insulation material that does not permeate oxygen or moisture, and photo-curing resin or thermosetting resin may be used. For example, epoxy resin or acrylate resin may be used.

The display device is formed as described above.

Figure 7:
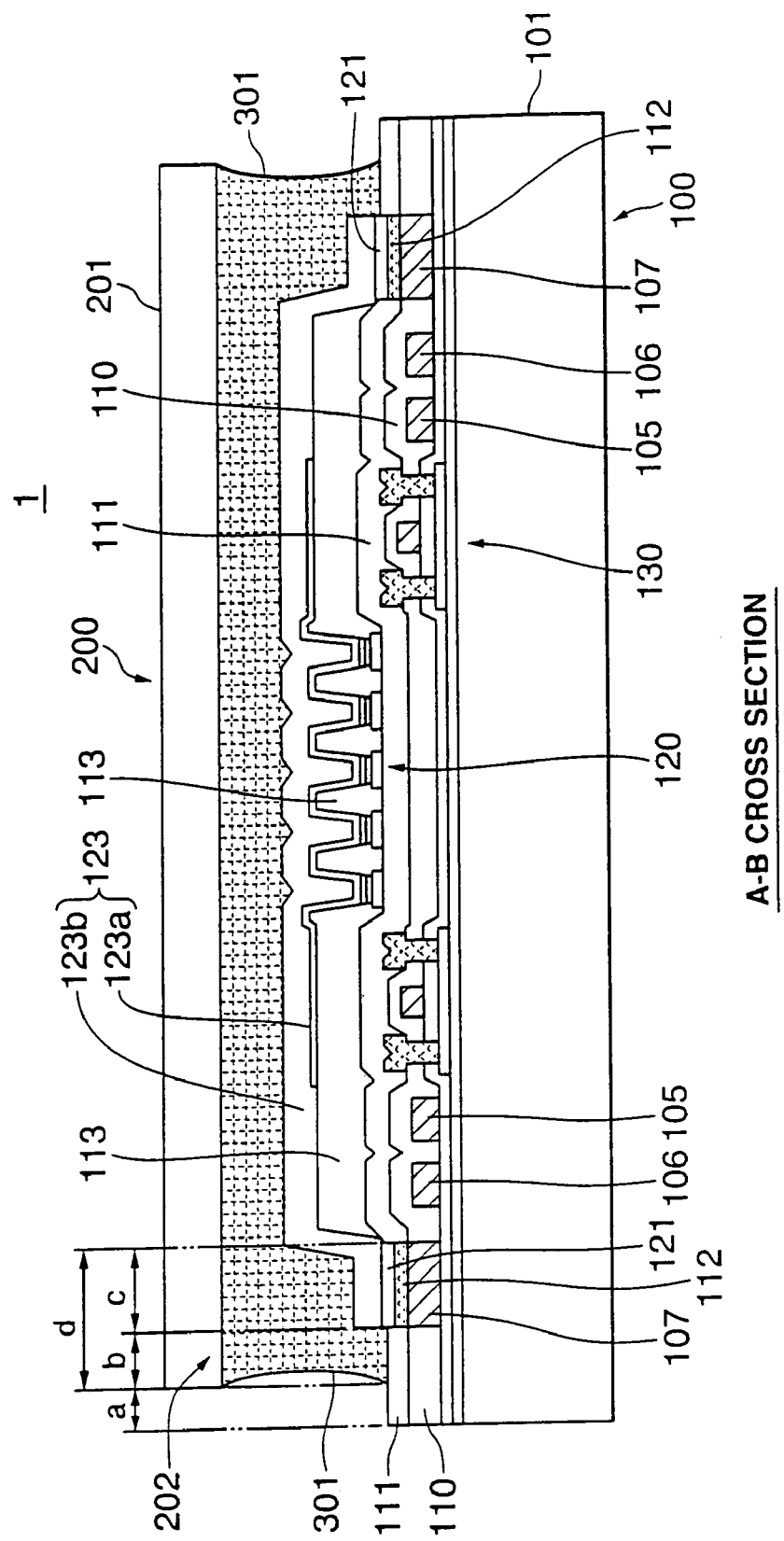
FIG. 7 is a cross section along section A-B of FIG. 1 for explaining the second embodiment (example of adhering the entire face of the sealing substrate) of the display device according to the present invention.

The second embodiment is illustrated in FIG. 7 and FIG. 8. In these diagrams, the components corresponding to those illustrated in FIG. 2 and FIG. 3 are given the same reference numerals, and the explanation of such components is omitted.

In the present embodiment, a flat substrate is used as the sealing substrate 200. As the sealing substrate 200, preferably employed may be a glass plate, aluminum plate, stainless plate, acryl plate, ceramic plate, and so on. The adhesive 301 is used to fill the entire gap between the TFT substrate 100 and the sealing substrate 200 so as to join (bond) the two substrates. Even in this case also, the width of margins b+c necessary in securing the reliability of sealing described above including the connection area of the negative electrode 123 and the wiring film 107 of the substrate is secured, and the bank layer 113 is positioned to be inside the connection area of the negative electrode 123 and the wiring film 107 of the substrate. Thereby, the frame width can be narrowed, and, infiltration of gas into the bank layer 113 can be prevented as a result of placing the resin film 113, which has relatively high moisture permeability, away from the adhesive 301.

FIG. 9(a) to FIG. 9(d) are process charts for explaining the manufacturing process of the display device 1 according to the second embodiment. In these diagrams, the components corresponding to those illustrated in FIG. 6 are given the same reference numerals, and the explanation of such components is omitted.

Figure 6A:
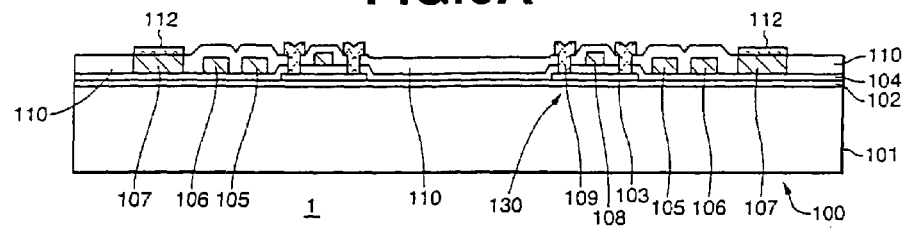
FIGS. 6(a)–6(d) are process charts for explaining the manufacturing process of the display device according to the first embodiment.
Figure 6B:
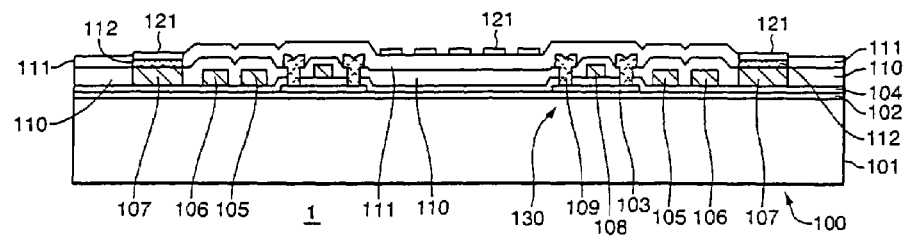
Figure 6C:
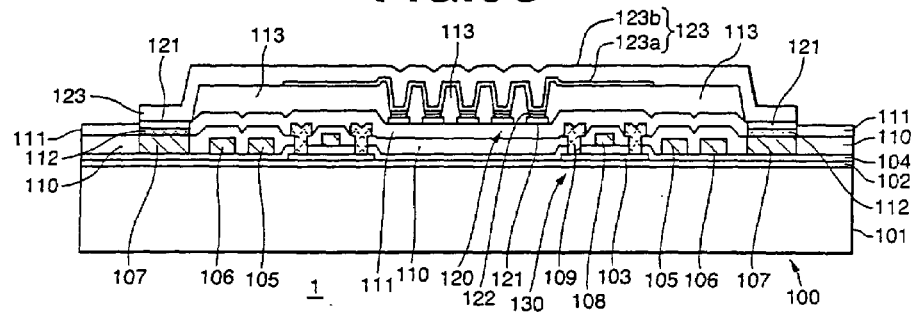
Figure 6D:
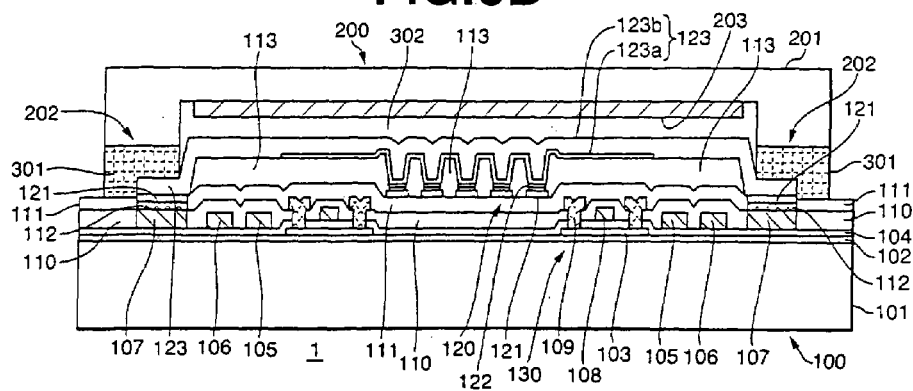
Figure 9A:
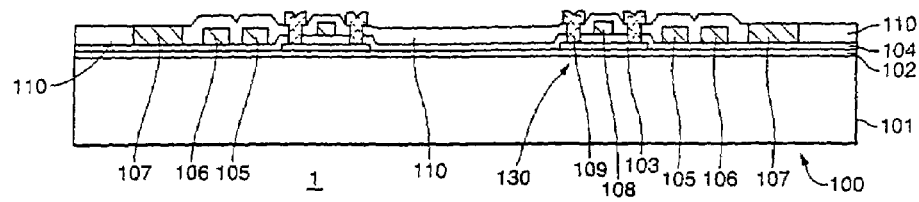
FIGS. 9(a)–9(d) are process charts for explaining the manufacturing process of the display device according to the second embodiment.
Figure 9B:
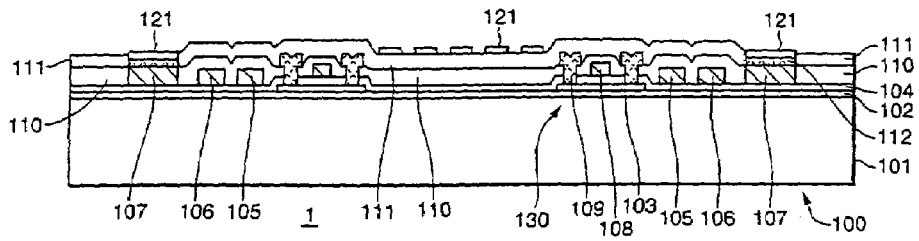
Figure 9C:
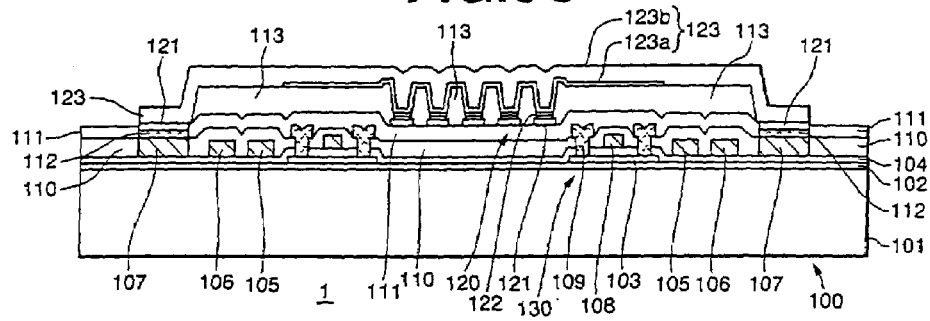
Figure 9D:
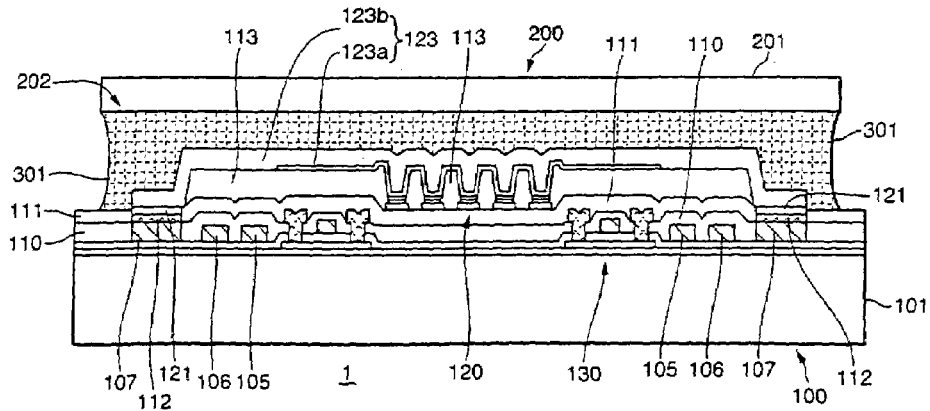

In this display device also, the processes of FIG. 9(a) to FIG. 9(c) are similarly conducted as with FIG. 6(a) to FIG. 6(c).

As shown in FIG. 9(c), after the TFT substrate 100 is formed, the adhesive 301 is applied to the top face of the TFT substrate 100 with the spin coating method, ink-jet method or transcription roller to achieve a suitable film thickness. The sealing substrate 200 is bonded on top of this adhesive film while being aligned with the TFT substrate 100.

Moreover, the adhesive 301 may also be applied to the sealing substrate 200 for bonding with the TFT substrate 100. Further, after aligning the sealing substrate 200 and the TFT substrate 100, an adhesive may be infiltrated inside from the peripheral gaps with the capillary phenomenon.

The third embodiment is illustrated in FIG. 10 and FIG. 11. In these diagrams, the components corresponding to those illustrated in FIG. 2 and FIG. 3 are given the same reference numerals, and the explanation of such components is omitted.

In the present embodiment, a multilayer thin film 210 is formed instead of the sealing substrate 200. For example, Japanese Patent Laid-Open Publication No. 2000-223264 proposes a laminate film of an inorganic passivation sealing film and resin sealing film as the sealing film. The multilayer thin film 210 is formed on the TFT substrate 100, and covers the negative electrode 123 in its entirety. The multilayer thin film may adopt the various structures; for instance, the structure of an organic layer/inorganic layer/organic layer, or inorganic layer/organic layer/inorganic layer, and so on. As the inorganic material, for example, ceramic materials such as $SiO_2$, SiN and SiON may be used, and, as the organic resin material, general hydrocarbon macromolecules such as polyethylene, polystyrene and polypropylene may be used. Moreover, this may also be fluoric macromolecules. The polymer materials themselves may be disposed, or precursors or monomers may be applied on the substrate for curing. The negative electrode 123 is connected to the power source wiring 107 at the end side of the substrate 100. Even in this case also, the width of margins b+c necessary in securing the reliability of sealing described above including the connection area of the negative electrode 123 and the wiring film 107 of the substrate is secured, and the bank layer 113 is positioned to be inside the connection area of the negative electrode 123 and the wiring film 107 of the substrate. Thereby, the frame can be narrowed.

FIG. 12(a) to FIG. 12(d) are process charts for explaining the manufacturing process of the display device 1 according to the third embodiment. In these diagrams, the components corresponding to those illustrated in FIG. 6 are given the same reference numerals, and the explanation of such components is omitted.

Figure 12A:
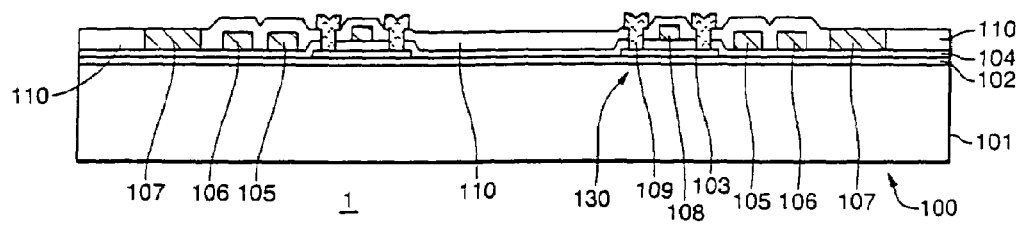
FIGS. 12(a)–12(d) are process charts for explaining the manufacturing process of the display device according to the third embodiment.
Figure 12B:
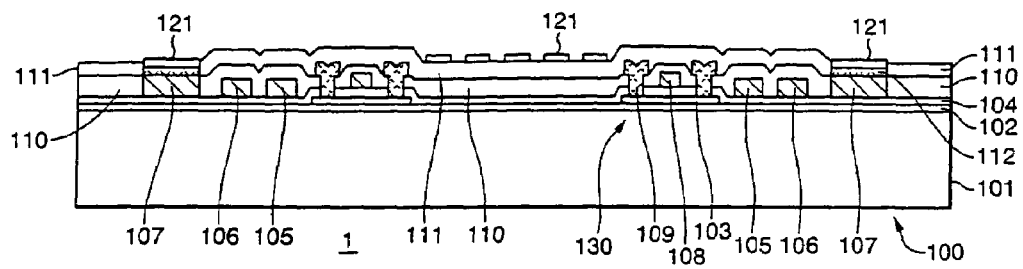
Figure 12C:
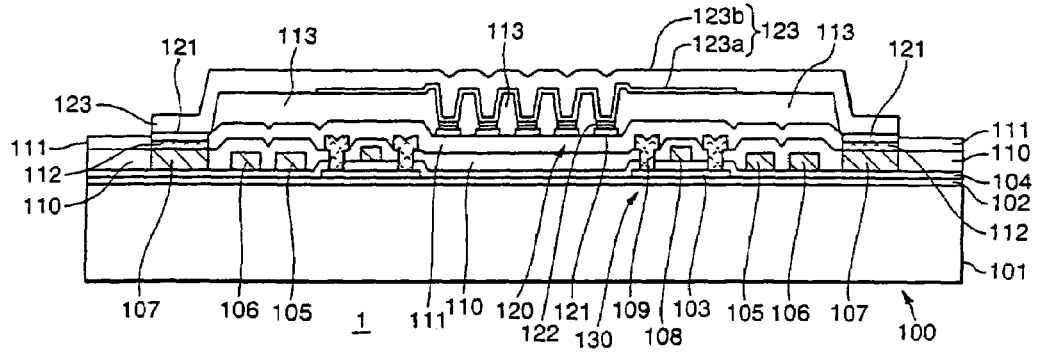

In this display device also, the processes of FIG. 12(a) to FIG. 12(c) are similarly conducted as with FIG. 6(a) to FIG. 6(c).

Figure 12D:
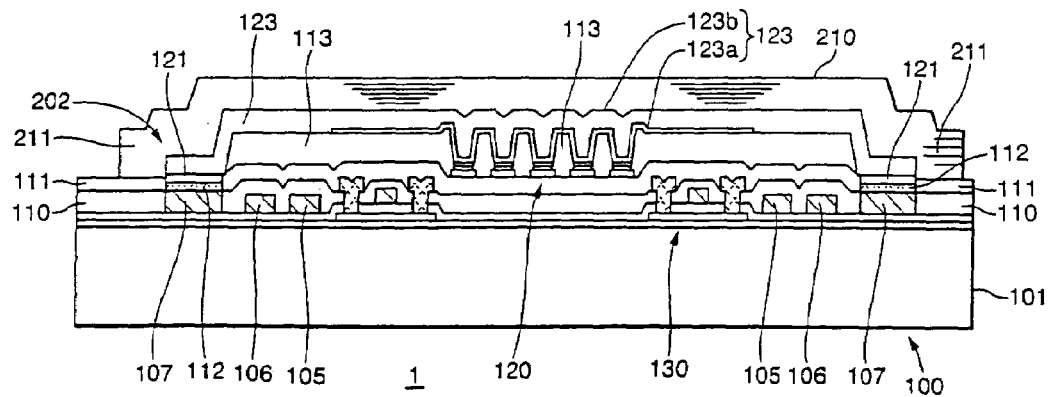

As shown in FIG. 12(c), after the TFT substrate 100 is formed, as shown in FIG. 12(d), a highly airtight protective film 210 is used to cover the TFT substrate 100 so as to prevent the negative electrode 123 from being exposed to the outside air, and patterning is performed to the periphery thereof in order to enable separation of the substrate. The protective film 210 is preferably a multilayer thin film. As described above, the multilayer thin film may be formed by laminating an organic layer/inorganic layer/organic layer, or inorganic layer/organic layer/inorganic layer, and so on. As the inorganic material, for example, ceramic materials such as $SiO_2$, SiN and SiON may be used, and, as the organic resin material, general hydrocarbon macromolecules such as polyethylene, polystyrene and polypropylene may be used. Moreover, this may also be fluoric macromolecules. The polymer materials themselves may be disposed, or precursors or monomers may be applied on the substrate for curing.

Figure 13:
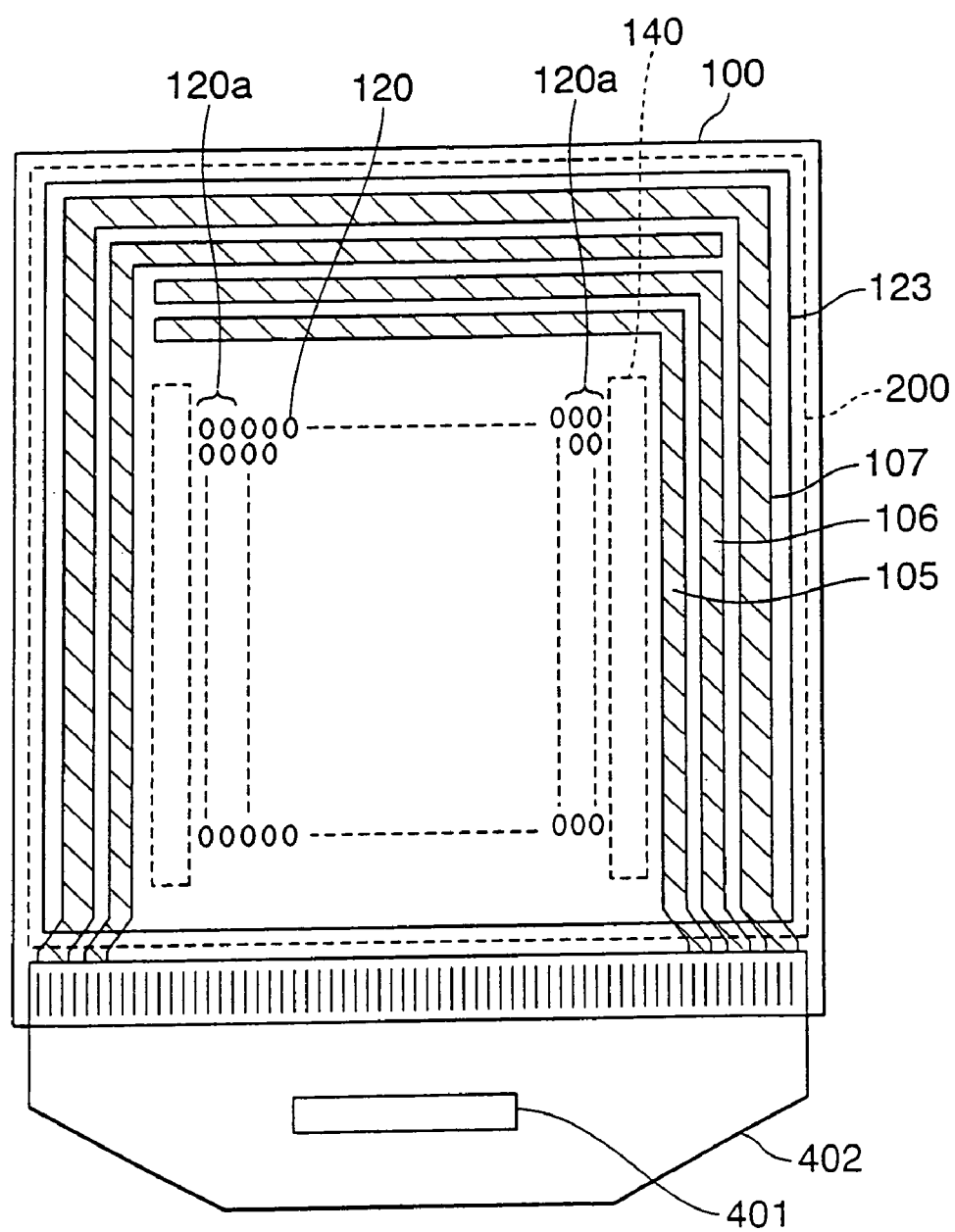
FIG. 13 is a plan view for explaining the fourth embodiment (example of employing dummy pixels) of the display device according to the present invention.

FIG. 13 illustrates the fourth embodiment of the present invention. In the present embodiment, an example is illustrated where dummy pixels are further added to the display area of the display device of the foregoing first to third embodiments.

Gas infiltrated inside the display device will penetrate within the film and affect the display area from the display elements on the peripheral side. Thus, by providing in advance dummy pixels that are not used in image display at the periphery of the display area, influence of the infiltrated gas to the screen display is alleviated. Moreover, as a result of providing dummy pixels at the periphery of the display area, the applied film can be formed evenly when a luminous material is applied with the inkjet method. In other words, with the inkjet method, minute ink (material) droplets are discharged from the nozzle, and, after the start of such discharge, time is required for the discharged rate to become stable. As a result of stabilizing the discharge rate at the dummy pixel portion, the coating film of the respective light emitting elements can be made uniform.

Moreover, the mask deposition method may also be employed instead of the inkjet method for forming the luminous body. Further, the inkjet method and mask deposition method may be used in combination.

FIG. 14 to FIG. 17 illustrate yet other embodiments of the present invention. In the respective diagrams, the components corresponding to those illustrated in FIG. 1 are given the same reference numerals, and the explanation of such components is omitted.

In these embodiments, although the TFT substrate and the sealing substrate are placed together and sealed at the periphery of the substrates, one or more sides, or all of the sides of the periphery of the TFT substrate are narrowed.

Figure 14:
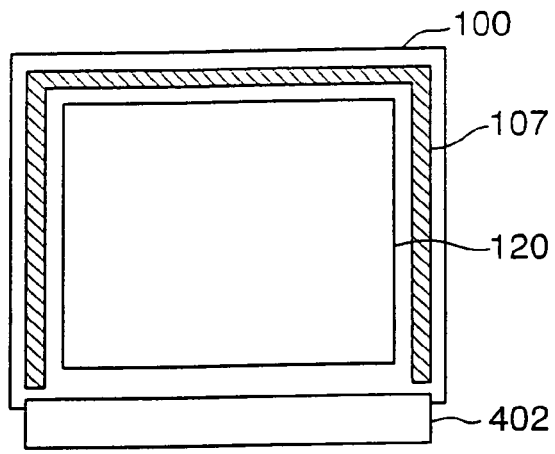
FIG. 14 is an explanatory diagram for explaining an example of connecting the power source wiring and common electrode at three sides of the substrate.

With the embodiment illustrated in FIG. 1 and FIG. 2, as shown in FIG. 14, the power source wiring 107 and the common electrode (negative electrode) 123 are connected at the three sides (upper side, left side, right side) of the square (polygonal) substrate 100, narrowing of the frame is sought by sealing the outside areas thereof, and the driver IC (external circuit) is connected with the wiring tape 402 at one side (lower side). According to this structure, wiring resistance can be reduced up to the common electrode 123 with the connection at three sides, and, since one side can be dedicated to connection with the external circuit, the frame of the overall display device module can be narrowed in a well-balanced manner.

Figure 15:
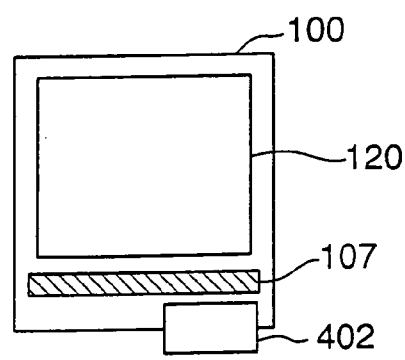
FIG. 15 is an explanatory diagram for explaining an example of connecting the power source wiring and common electrode at one side of the substrate.

With the embodiment illustrated in FIG. 15, the power source wiring 107 and the common electrode (negative electrode) 123 are connected at one side (lower side) of the substrate 100, and sealing is performed at the outside area thereof. In this example, since the common electrode 123 and the wiring film 107 are connected at only one side, it is difficult to narrow the frame since a sufficient conductive area (vertical conductive area) must be secured between the common electrode 123 and the wiring film 107 with this one side. Nevertheless, since the wiring with the common electrode 123 will no longer be necessary at the other three sides, the frame portion of such three sides can be narrowed significantly. This kind of structure is effective in cases as with a display device of a portable telephone wherein the module may be elongated in a certain direction, but is restricted in other directions.

Figure 16:
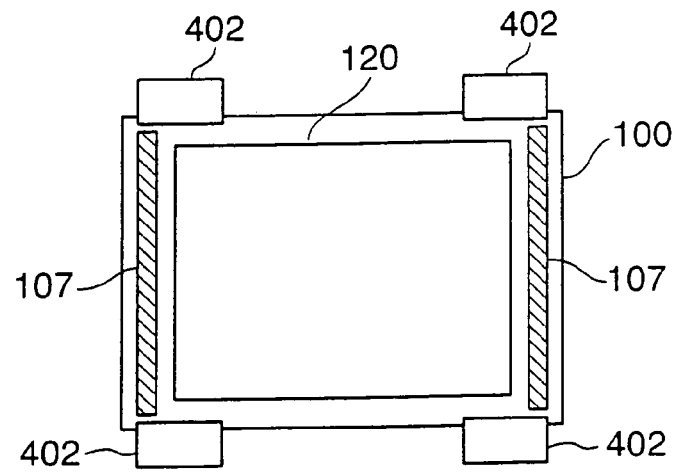
FIG. 16 is an explanatory diagram for explaining an example of connecting the power source wiring and common electrode at two sides of the substrate.

With the embodiment illustrated in FIG. 16, the common electrode 123 and the wiring film 107 are connected at two sides (left side and right side) of the substrate 100, and sealing is performed respectively to the outside areas thereof. When providing the wiring tape 402 to either side (upper side and lower side) facing each other, respectively, in order to install an external circuit, for instance, this is effective when driving the odd number lines from the top and driving the even number lines from the bottom, and a large capacity (large screen) display is enabled by mounting numerous driver ICs. Moreover, with this structure, the reduction of wiring resistance comparable with the case of connecting the common electrode 123 and the wiring film 107 at three sides as depicted in FIG. 14 may be sought.

Figure 17:
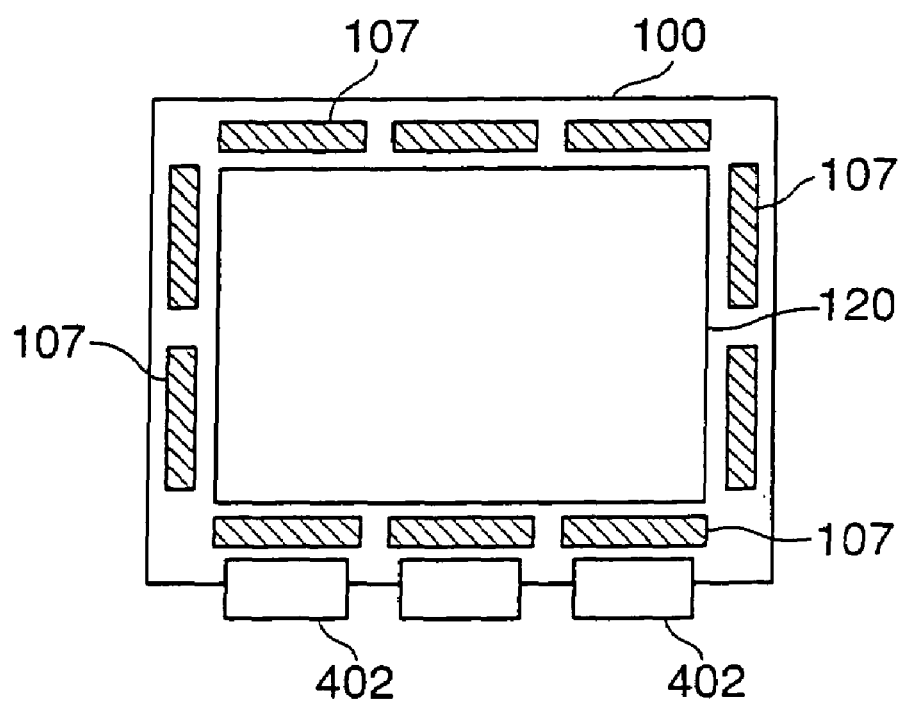
FIG. 17 is an explanatory diagram for explaining an example of connecting the power source wiring and common electrode at four sides of the substrate.

With the embodiment illustrated in FIG. 17, the common electrode 123 and the wiring film 107 are connected at four sides (upper side, lower side, left side, right side) of the substrate 100, and sealing is performed respectively to the outside areas thereof. Then, a pullout wiring is formed via the insulation film at the lower part of the wiring for seeking conductivity between the common electrode 123 and the wiring film 107 with the multilayer wiring film, and this wiring is connected with an external circuit. Moreover, the conductive area for connecting the common electrode 123 and the wiring film 107 may be separated into a plurality of blocks, and a pullout wiring may be disposed between the mutual blocks. According to this kind of structure, sufficient reduction of wiring resistance required for realizing a large-size high resolution display can be attained.

As described above, according to the respective embodiments of the present invention, since the display device is assembled such that the connection area (c) of the common electrode (negative electrode) 123 and the substrate wiring 107 is included within the sealing margin (b+c), the frame area of the display unit can be reduced.

Moreover, since the bank layer 113 is positioned to be further inside the substrate than the connection area (c) of the common electrode 123 and the substrate wiring 107, it is possible to prevent gas from directly penetrating within the bank layer 113 from the connection portion (b+c) of the substrate 100 and the sealing substrate (or sealing film) 200. Thereby, influence on the light emitting element 120 will be minimal even upon employing a resin (such as a photoresist), which can be processed easily, as the bank layer 113.

Moreover, as a result of placing the calcium electrode 123a away from the connection area (c) of the electrode 123a and the substrate wiring 107, erosion of the calcium electrode 123a due to infiltration of oxygen or water vapor gas can be prevented.

Next, electronic devices comprising the display device according to the present invention are described below. The present invention, however, shall in no way be limited to these exemplifications.

<Mobile Computer>

Figure 18:
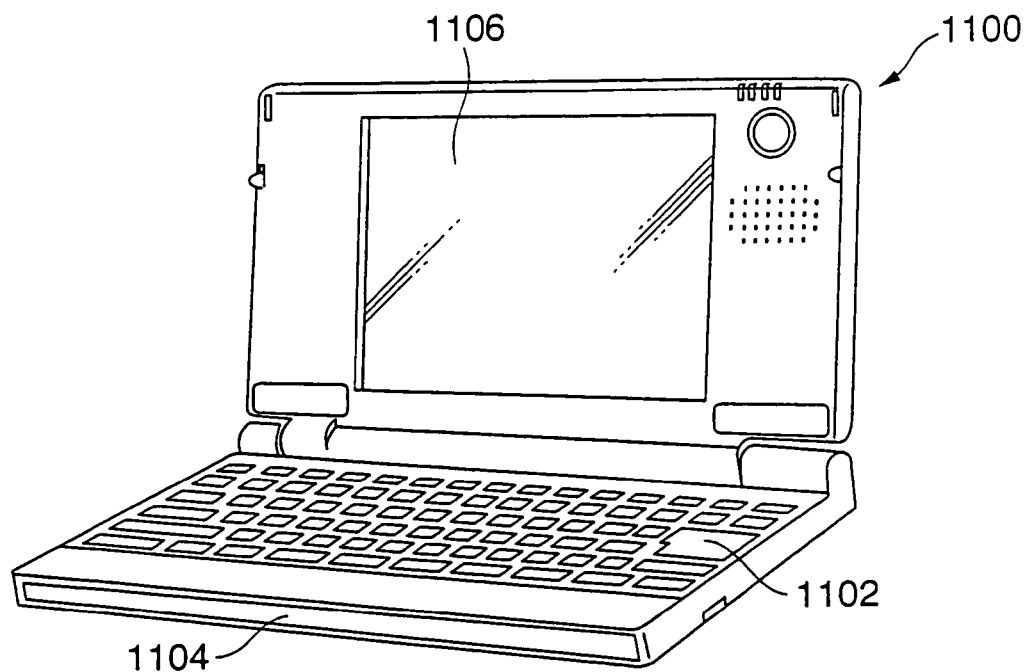
FIG. 18 is an explanatory diagram for explaining an example of a portable personal computer employing the display device according to the present invention.

Foremost, an example employing the display device pertaining to the foregoing embodiments in a mobile personal computer is explained. FIG. 18 is a perspective view showing the structure of this personal computer. In FIG. 18, the personal computer 1100 is structured from a main body 1104 comprising a keyboard 1102, and a display device unit comprising the foregoing display device 1106.

<Portable Phone>

Figure 19:
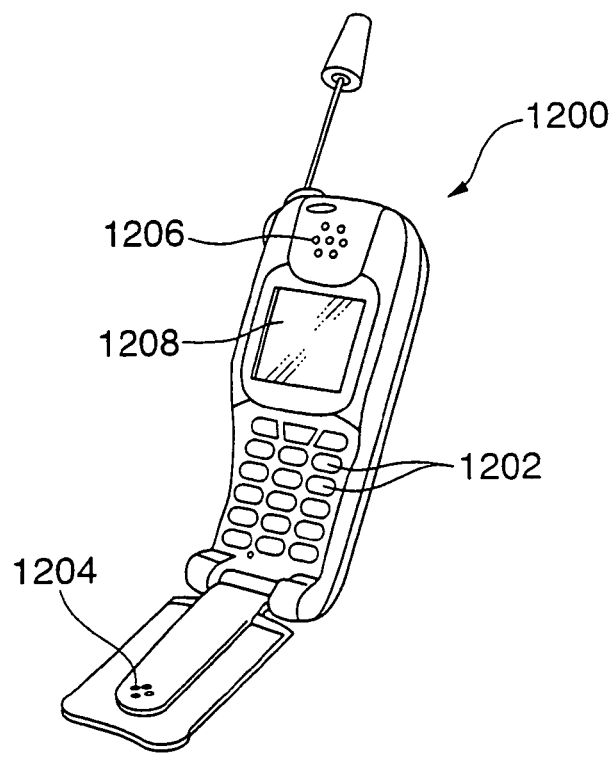
FIG. 19 is an explanatory diagram for explaining an example of a portable telephone device employing the display device according to the present invention.

Next, an example of employing the display device pertaining to the foregoing embodiments in the display unit of a portable telephone is explained. FIG. 19 is a perspective view showing the structure of this portable telephone. In FIG. 19, the portable telephone 1200 comprises a plurality of operation buttons 1202, an earpiece 1206, a mouthpiece 1024, and the foregoing display device 1208.

<Digital Still Camera>

Figure 20:
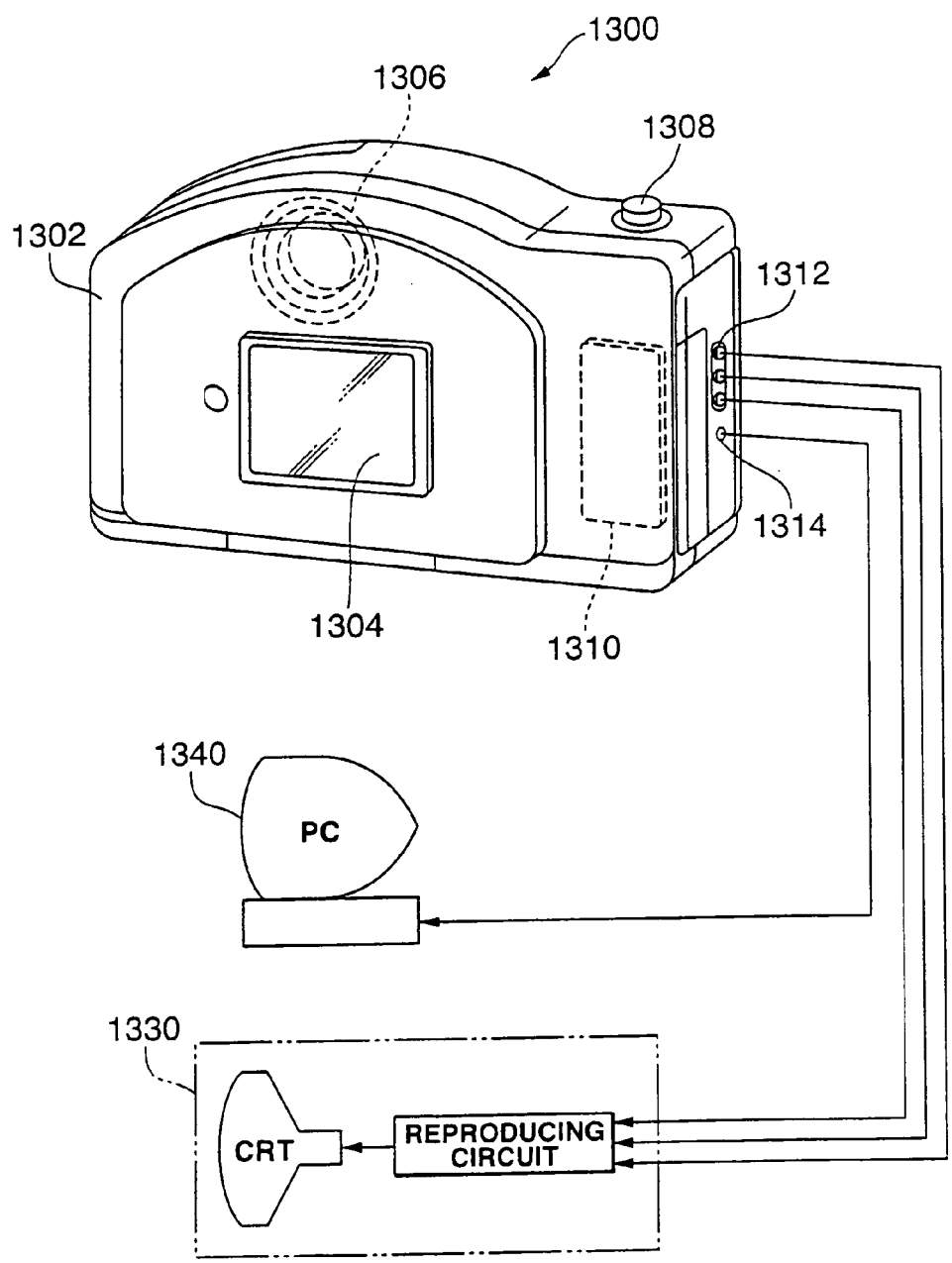
FIG. 20 is an explanatory diagram for explaining an example of a digital camera employing the display device according to the present invention.

An example of employing the display device pertaining to the foregoing embodiments in the finder of a digital still camera is now explained. FIG. 20 is a perspective view showing the structure of this digital still camera, and also briefly shows the connection with external equipment.

Whereas an ordinary camera exposes the film with the optical image of the photographic subject, the digital still camera 1300 generates image signals by performing photo-electric conversion to the optical image of the photographic subject with visual elements of a CCD (Charge Coupled Device) or the like. The foregoing display device 1304 is provided to the back face of the case 1302 of this digital still camera 1300, and is structured to conduct display based on the visual signals from the CCD. Thus, the display device 1304 functions as a finder for displaying the photographic subject. Moreover, a light receiving unit including the likes of an optical lens or CCD is provided to the observation side of the case 1302.

When the photographer confirms the image of the photographic subject displayed on the display device 1304 and presses the shutter button 1308, the visual signal of the CCD at such moment is transmitted to and stored in the memory of the circuit substrate 1310. Moreover, this digital still camera 1300 also comprises a video signal output terminal 1312 and a data transmission I/O terminal 1314 at the side face of the case 1302. And, as illustrated in FIG. 20, a television monitor 1330 is connected to the video signal output terminal 1312 and a personal computer 1340 is connected to the data transmission I/O terminal 1314, respectively, as necessary. Further, pursuant to prescribed operations, the structure is such that the visual signal stored in the memory of the circuit substrate 1308 is output to the television monitor 1330 or the computer 1340.

<Electronic Book>

Figure 21:
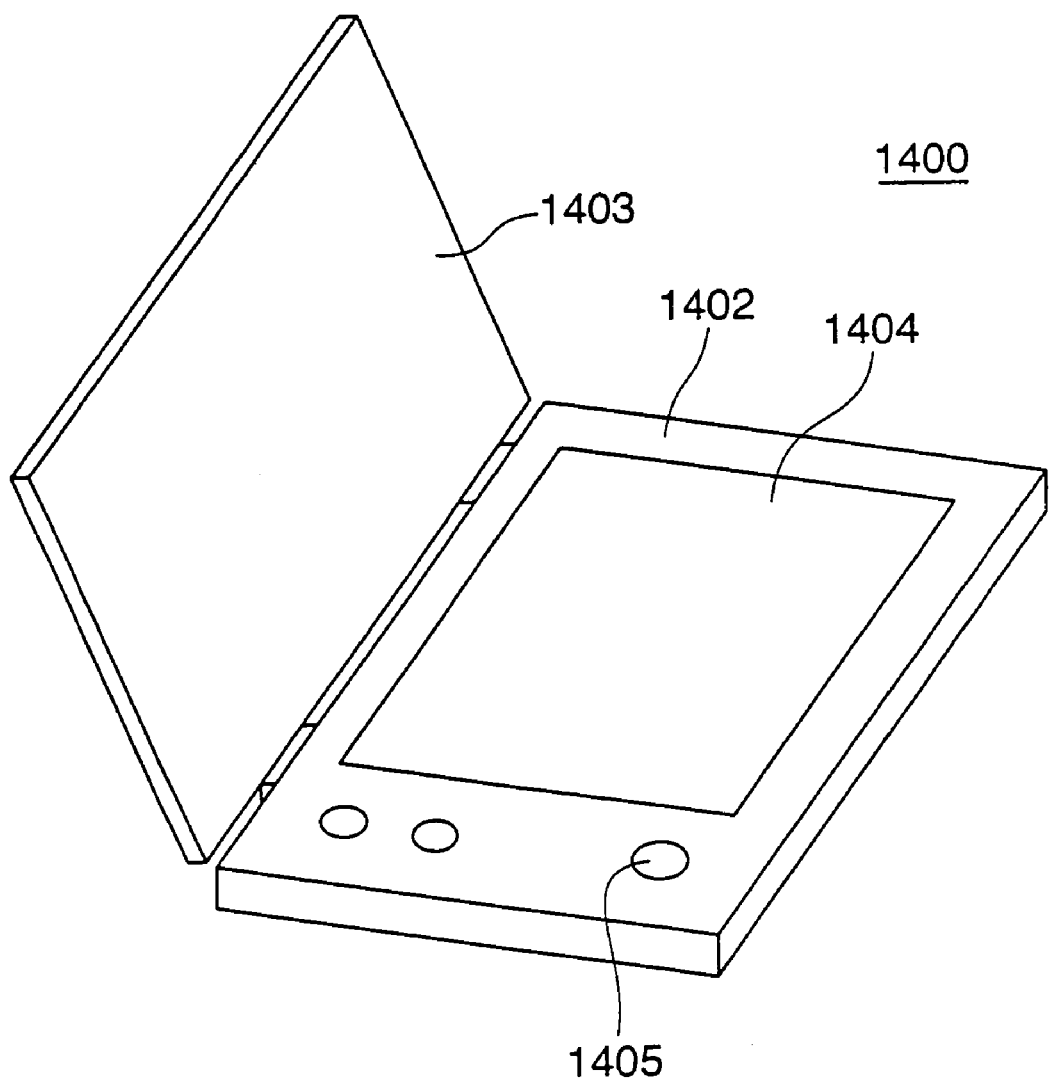
FIG. 21 is an explanatory diagram for explaining an example of an electronic book employing the display device according to the present invention.

FIG. 21 is a perspective view showing the structure of an electronic book as an example of the electronic device according to the present invention. In FIG. 21, reference numeral 1400 represents the electronic book. The electronic book 1400 comprises a book-shaped frame 1402 and a cover 1403 capable of opening and closing this frame 1402. A display device 1404 is provided to the frame 1402 in a state where its display face is exposed to the surface thereof, and, an operation unit 1405 is also provided thereto. A controller, counter, memory and so on are built in the frame 1402. In the present embodiment, the display device 1404 comprises a pixel portion to which display elements are disposed and an integrated peripheral circuit that is provided integrally with such pixel portion. The peripheral circuit comprises a decoder scan driver and data driver.

Moreover, as the electronic device, in addition to the personal computer of FIG. 18, the portable telephone of FIG. 19, the digital still camera of FIG. 20 and the electronic book of FIG. 21, electronic paper, liquid crystal televisions, view-finding or monitor-viewing video tape recorders, car navigation devices, pagers, electronic notebooks, calculators, word processors, workstations, television phones, OS terminals, devices comprising a touch panel and so on also apply. And, the foregoing display device may be employed as the display unit of the respective electronic devices described above.

The display device according to the present invention is not limited to the organic EL display device of the embodiments. Moreover, the substrate is not limited to the TFT substrate of the embodiments. In addition to an active substrate, the present invention can also be employed in a passive substrate.

Moreover, although an adhesive was used as the joining means in the embodiments, it is not limited thereto. Other methods, for instance, joining with supersonic waves or lasers may also be employed.

As described above, according to the display device of the present invention, it is preferable in that the width of the frame, which is the non-display area at the periphery of the display area, can be narrowed.

What is claimed is:

1. A display device, comprising:
   a substrate including a plurality of display elements, a bank layer that separates each of the display elements, and a wiring layer;
   a common electrode layer that is spread out to the periphery of the substrate and covers said plurality of display elements and said bank layer; and
   a multilayer thin film for covering the substrate,
   wherein a flat peripheral portion of the common electrode layer is laminated to a flat top face of the wiring layer through laminated flat conductive films which form a linear electrical connection area in plane, and the connection area is continuously positioned outside of the bank layer along sides of the substrate where a wiring tape is not connected, and the multilayer thin film extends beyond the connection area of the common electrode layer and the wiring layer.

2. The display device according to claim 1, wherein at least one thin film among the multilayer thin film has gas barrier properties or anti-environmental properties.

3. The display device according to claim 1, wherein the substrate is a square substrate, and the common electrode layer and the wiring layer are connected at one side of the substrate by laminating the common electrode layer and the wiring layer together using the laminated flat conductive films.

4. The display device according to claim 1, wherein the substrate is a square substrate, and the common electrode layer and the wiring layer are connected at two sides of the substrate by laminating the common electrode layer and the wiring layer together using the laminated flat conductive films.

5. The display device according to claim 1, wherein the substrate is a square substrate, and the common electrode layer and the wiring layer are connected at three sides of the substrate by laminating the common electrode layer and the wiring layer together using the laminated flat conductive films.

6. The display device according to claim 1, wherein the multilayer thin film includes an inorganic layer.

7. The display device according to claim 6, wherein the inorganic layer is made of a material selected from $SiO_2$, SiN and SiON.

8. The display device according to claim 1, wherein the multilayer thin film includes an organic layer.

9. The display device according to claim 8, wherein the organic layer includes fluoric macromolecules.

10. The display device according to claim 8, wherein the organic layer is made of a material selected from polyethylene, polystyrene and polypropylene.

11. The display device according to claim 1, wherein the multilayer thin film is formed by laminating an organic layer/inorganic layer/organic layer.

12. The display device according to claim 1, wherein the multilayer thin film is formed by laminating an inorganic layer/organic layer/inorganic layer.

13. A manufacturing method of a display device, comprising:
    a step of forming at least a wiring layer at a part of the periphery of a substrate to which an electrical circuit is to be formed;
    a step of forming an element separation layer comprising a plurality of grooves for mutually separating a plurality of display elements excluding an area over the wiring layer of the substrate;
    a step of forming said display elements to each of the plurality of grooves of the element separation layer;
    a step of forming a common electrode layer on the plurality of display elements, the element separation layer, and the wiring layer, respectively; and
    a sealing step of directly forming a multilayer thin film above the common electrode layer and the substrate;
    wherein a flat peripheral portion of the common electrode layer is laminated to a flat top face of the wiring layer through laminated flat conductive films which form a linear electrical connection area in plane; and the connection area is continuously positioned outside of the element separation layer along sides of the substrate where a wiring tape is not connected, and the multilayer thin film extends beyond the connection area.

* * * * *